United States Patent
Lung

(10) Patent No.: US 7,879,643 B2
(45) Date of Patent: Feb. 1, 2011

(54) MEMORY CELL WITH MEMORY ELEMENT CONTACTING AN INVERTED T-SHAPED BOTTOM ELECTRODE

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 267 days.

(21) Appl. No.: 12/016,840

(22) Filed: Jan. 18, 2008

(65) Prior Publication Data

US 2009/0184310 A1 Jul. 23, 2009

(51) Int. Cl.
*H01L 21/00* (2006.01)
*H01L 21/336* (2006.01)

(52) U.S. Cl. .................... 438/95; 438/97; 438/597; 438/699; 257/2; 257/3; 257/4; 257/5; 257/529; 257/755; 257/E27.004; 257/E31.029; 257/E45.002

(58) Field of Classification Search .................. 438/95, 438/97, 597, 699; 257/2, 3, 4, 5, 529, 755, 257/E27.004, E31.029, E45.002
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,769,339 A | 9/1988 | Ishii | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe | |
| 5,534,712 A | 7/1996 | Ovshinsky et al. | |
| 5,550,396 A | 8/1996 | Tsutsumi et al. | |
| 5,687,112 A | 11/1997 | Ovshinsky | |

(Continued)

FOREIGN PATENT DOCUMENTS

CN 1462478 12/2003

(Continued)

OTHER PUBLICATIONS

"Magnetic Bit Boost," www.sciencenews.org, Dec. 18 & 25, 2004, p. 389, vol. 166.

(Continued)

*Primary Examiner*—Dao H Nguyen
(74) *Attorney, Agent, or Firm*—Haynes Beffel & Wolfeld LLP

(57) ABSTRACT

Memory cells are described along with methods for manufacturing. A memory cell described herein includes a bottom electrode comprising a base portion and a pillar portion on the base portion, the pillar portion having a top surface and a width less than that of the base portion. A memory element is on the top surface of the pillar portion and comprises memory material having at least two solid phases. A top electrode is on the memory element.

10 Claims, 11 Drawing Sheets

U.S. PATENT DOCUMENTS

| | | | |
|---|---|---|---|
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,329,666 B1 | 12/2001 | Doan et al. | |
| 6,339,544 B1 | 1/2002 | Chiang et al. | |
| 6,351,406 B1 | 2/2002 | Johnson et al. | |
| 6,372,650 B2 | 4/2002 | Kato | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,569,709 B2 | 5/2003 | Derderian | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,620,715 B1 | 9/2003 | Blosse et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,709,887 B2 | 3/2004 | Moore et al. | |
| 6,744,088 B1 | 6/2004 | Dennison | |
| 6,746,892 B2 | 6/2004 | Lee et al. | |
| 6,750,079 B2 * | 6/2004 | Lowrey et al. | 438/95 |
| 6,768,665 B2 | 7/2004 | Parkinson et al. | |
| 6,791,102 B2 | 9/2004 | Johnson et al. | |
| 6,791,859 B2 | 9/2004 | Hush et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,805,563 B2 | 10/2004 | Ohashi et al. | |
| 6,808,991 B1 | 10/2004 | Tung et al. | |
| 6,815,704 B1 | 11/2004 | Chen | |
| 6,830,952 B2 | 12/2004 | Lung et al. | |
| 6,850,432 B2 | 2/2005 | Lu et al. | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,304 B2 | 5/2005 | Moore | |
| 6,894,305 B2 | 5/2005 | Yi et al. | |
| 6,897,467 B2 * | 5/2005 | Doan et al. | 257/4 |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowery et al. | |
| 6,969,866 B1 | 11/2005 | Lowery et al. | |
| 6,972,428 B2 | 12/2005 | Maimon | |
| 6,972,430 B2 | 12/2005 | Casagrande et al. | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,038,938 B2 | 5/2006 | Kang | |
| 7,042,001 B2 | 5/2006 | Kim et al. | |
| 7,067,864 B2 | 6/2006 | Nishida et al. | |
| 7,067,865 B2 | 6/2006 | Lung et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,132,675 B2 | 11/2006 | Gilton | |
| 7,154,774 B2 | 12/2006 | Bedeschi et al. | |
| 7,164,147 B2 | 1/2007 | Lee et al. | |
| 7,166,533 B2 | 1/2007 | Happ | |
| 7,169,635 B2 | 1/2007 | Kozicki | |
| 7,208,751 B2 | 4/2007 | Ooishi | |
| 7,214,958 B2 | 5/2007 | Happ | |
| 7,220,983 B2 | 5/2007 | Lung | |

| | | |
|---|---|---|
| 7,238,994 B2 | 7/2007 | Chen et al. |
| 7,248,494 B2 | 7/2007 | Oh et al. |
| 7,251,157 B2 | 7/2007 | Osada et al. |
| 7,269,052 B2 | 9/2007 | Segal |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,365,385 B2 | 4/2008 | Abbott |
| 7,379,328 B2 | 5/2008 | Osada et al. |
| 7,385,235 B2 | 6/2008 | Lung |
| 7,394,088 B2 | 7/2008 | Lung |
| 7,560,337 B2 * | 7/2009 | Ho et al. ............ 438/257 |
| 2002/0070457 A1 | 6/2002 | Sun et al. |
| 2002/0113273 A1 | 8/2002 | Hwang et al. |
| 2005/0018526 A1 | 1/2005 | Lee |
| 2005/0029502 A1 | 2/2005 | Hudgens |
| 2005/0062087 A1 | 3/2005 | Chen et al. |
| 2005/0127347 A1 | 6/2005 | Choi et al. |
| 2005/0191804 A1 | 9/2005 | Lai et al. |
| 2005/0212024 A1 | 9/2005 | Happ |
| 2005/0215009 A1 | 9/2005 | Cho |
| 2006/0038221 A1 | 2/2006 | Lee et al. |
| 2006/0073642 A1 | 4/2006 | Yeh et al. |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0110888 A1 | 5/2006 | Cho et al. |
| 2006/0118913 A1 | 6/2006 | Yi et al. |
| 2006/0131555 A1 | 6/2006 | Liu et al. |
| 2006/0154185 A1 | 7/2006 | Ho et al. |
| 2006/0226409 A1 | 10/2006 | Burr et al. |
| 2006/0234138 A1 | 10/2006 | Fehihaber et al. |
| 2006/0284158 A1 | 12/2006 | Lung et al. |
| 2006/0284214 A1 | 12/2006 | Chen |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0037101 A1 | 2/2007 | Morioka |
| 2007/0045606 A1 | 3/2007 | Magistretti et al. |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0224726 A1 | 9/2007 | Chen et al. |
| 2007/0235811 A1 | 10/2007 | Furukawa et al. |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0014676 A1 | 1/2008 | Lung et al. |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "Highly Reliable 5nm Contact Cell Technology for 256Mb PRAM," VLSI Technology, Digest of Technical Papers, Jun. 14-16, 2005, pp. 98-99.

Ahn, S.J. et al., "A Highly Manufacturable High Density Phase Change Memory of 64 Mb and Beyond," IEEE IEDM 2004, pp. 907-910.

Atwood, G, et al., "90nm Phase Change Technology with μTrench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phrase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE $43^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurments of Thin Films Silicon Dioxide", Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

MEMORY CELL WITH MEMORY ELEMENT CONTACTING AN INVERTED T-SHAPED BOTTOM ELECTRODE

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, for example phase change memory (PCM) devices, and to methods for manufacturing such devices. The memory material is switchable between electrical property states by the application of energy. The memory materials may be phase change based memory materials, including chalcogenide based materials, and other materials.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell.

One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

One problem associated with manufacturing devices having very small electrodes arises because of poor adhesion of the very small electrodes, which can cause the bottom electrode to fall over during manufacturing.

Accordingly, it is desirable to provide a memory cell structure having a very small electrode to reduce the amount of power needed for reset while also addressing the mechanical stability issues of very small electrodes. Furthermore, it is desirable to provide methods for manufacturing such devices.

BRIEF SUMMARY OF THE INVENTION

A memory cell described herein includes a bottom electrode comprising a base portion and a pillar portion on the base portion, the pillar portion having a top surface and a width less than that of the base portion. A memory element is on the top surface of the pillar portion and comprises memory material having at least two solid phases. A top electrode in on the memory element.

A method for manufacturing a memory cell as described herein includes providing a memory access layer having a top surface, the memory access layer including a conductive plug extending to the top surface of the memory access layer. A layer of bottom electrode material is then formed on the top surface of the memory access layer, and first dielectric layer is formed on the bottom electrode material layer. An etch mask is formed on the first dielectric layer and overlying the conductive plug. Etching is performed to remove at least a portion of the first electrode material layer using the etch mask, thereby forming an electrode element comprising bottom electrode material and a dielectric element comprising the first dielectric layer on the electrode element. Isotropic etching is then performed on the dielectric element to create a trimmed dielectric element covering a portion of the top surface of the electrode element. Anisotropic etching is then performed on the electrode element using the trimmed dielectric element as a mask, thereby forming a bottom electrode comprising a base portion on the conductive plug and a pillar portion on the base portion, the pillar portion having a width less than that of the base portion. A second dielectric layer is then formed on the bottom electrode, and a top surface of the pillar portion is exposed using a planarizing process. A layer of memory material is then formed on the top surface of the pillar portion, and a top electrode material layer is formed on the memory material layer. The memory material layer and the top electrode layer are patterned to form a multi-layer stack.

A memory cell as described herein results in an active region within the memory element that can be made extremely small, thereby reducing the amount of current needed for reset. The extremely small active region is a result of the width of the pillar portion of the bottom electrode being less than the width of the memory element and preferably less than a minimum feature size for a process, typically a lithographic process, used to form the memory cell. The small pillar portion of the bottom electrode concentrates current density in the portion of the memory element adjacent the bottom electrode, thereby reducing the magnitude of the current needed to induce a phase change in the active region. The thickness of the memory element can be established using thin film deposition techniques and thus can be made very thin. Furthermore, dielectric material on the outside surface of the pillar portion can provide some thermal isolation to the active region.

The larger width of the base portion of the bottom electrode provides better adhesion of the bottom electrode and reduces the risk of the bottom electrode falling over during manufacturing than would be achieved if the base portion were the same width as the pillar portion. This improved mechanical stability of the bottom electrode improves the yield of the device during manufacturing.

Other features, aspects and advantages of the present invention can be seen on review the FIGS., the detailed description, and the claims which follow.

DETAILED DESCRIPTION OF THE INVENTION

Figure 1:
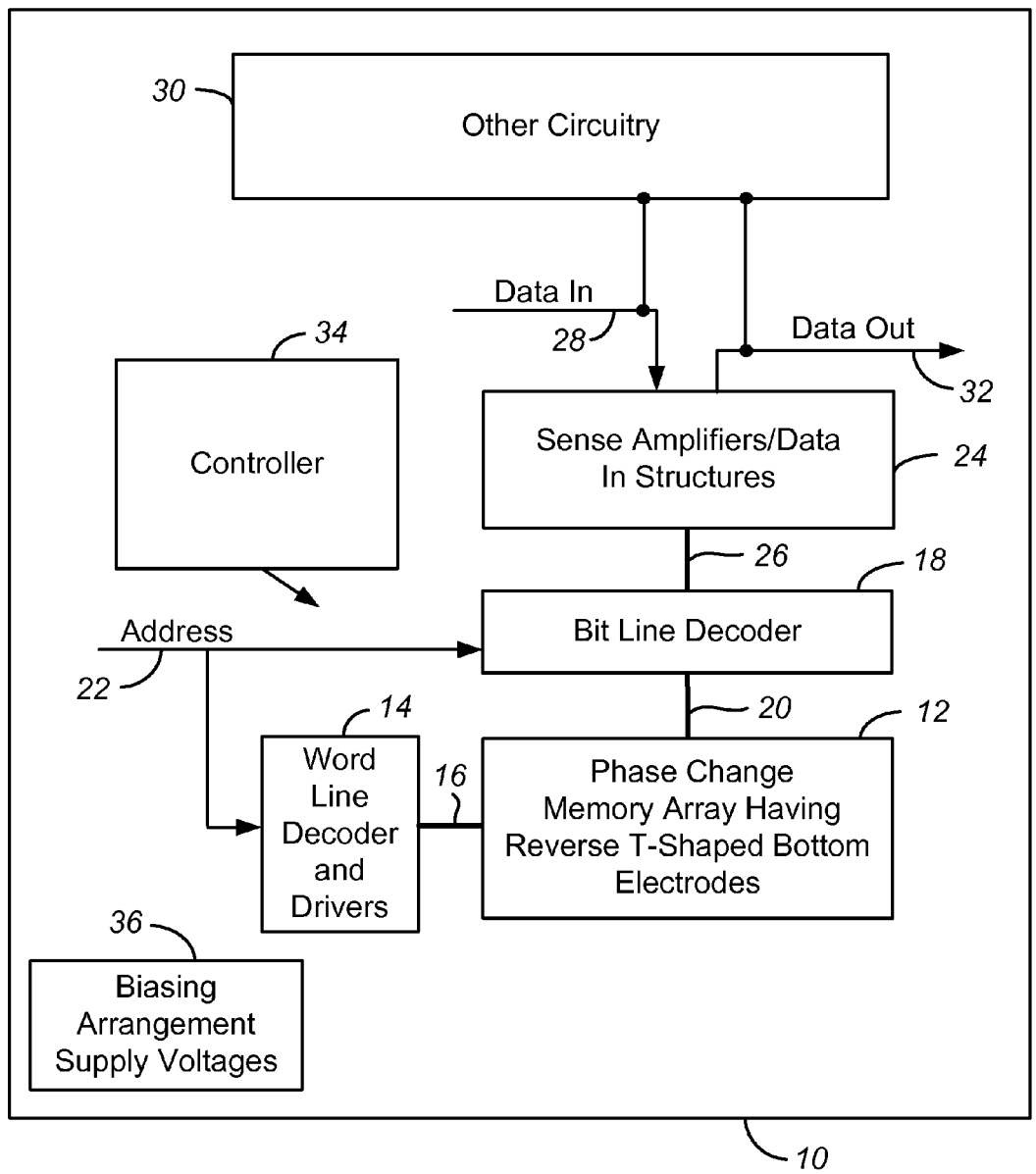
FIG. 1 is a simplified block diagram of an integrated circuit implemented using memory cells described herein having reverse t-shaped bottom electrodes.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a simplified block diagram of an integrated circuit 10 including a memory array 12 implemented using memory cells as described herein having inverted T-shaped bottom electrodes. A word line decoder 14 is coupled to and in electrical communication with a plurality of word lines 16. A bit line (column) decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2:
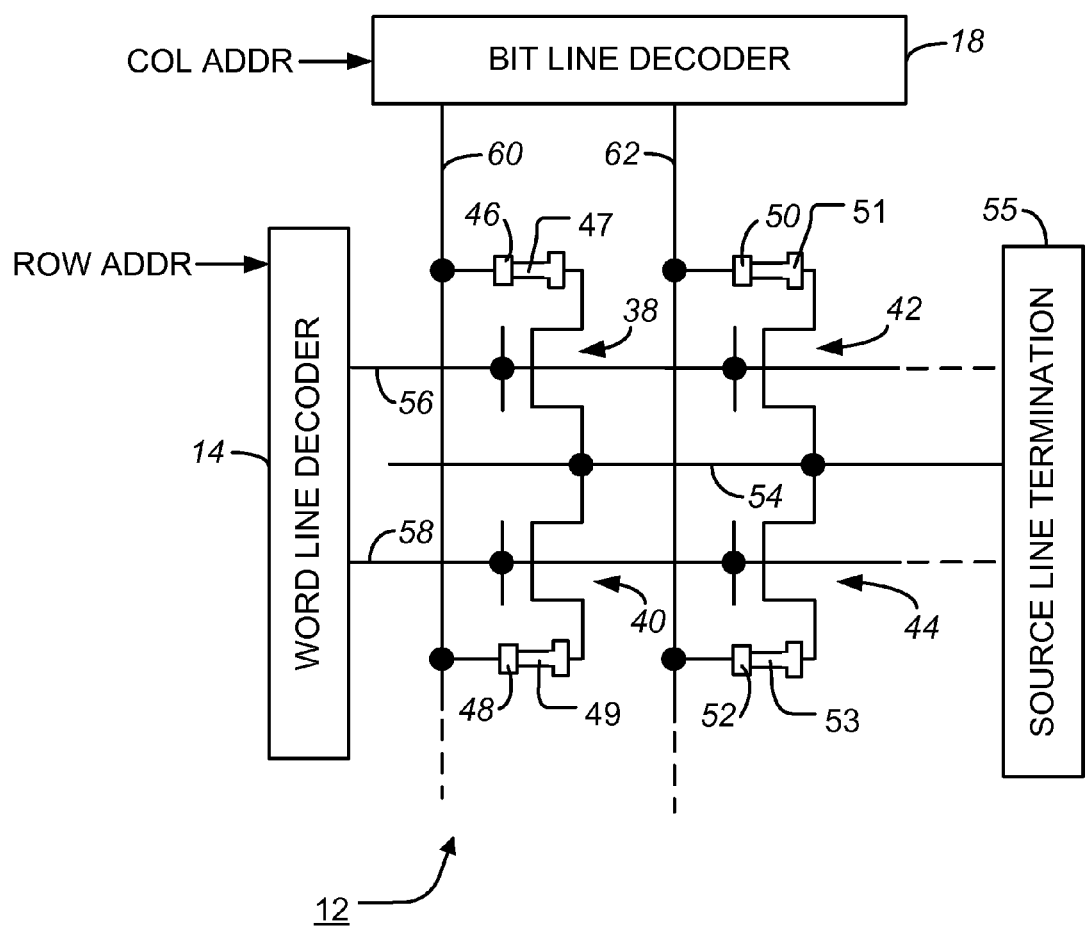
FIG. 2 is a portion of a memory array implemented using memory cells described herein having reverse t-shaped bottom electrodes.

As shown in FIG. 2 each of the memory cells of array 12 includes an access transistor (or other access device such as a diode), four of which are shown as 38, 40, 42 and 44, a phase change element shown as 46, 48, 50 and 52, and inverted T-shaped bottom electrode shown as 47, 49, 51, and 53. Sources of each of the access transistors 38, 40, 42 and 44 are connected in common to a source line 54 that terminates in a source line termination 55. In another embodiment the source lines of the select devices are not electrically connected, but independently controllable. A plurality of word lines including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality 20 of bit lines including bit lines 60 and 62 have one end of phase change elements 46 and 48 connected to bit line 60. Specifically, phase change element 46 is connected between the drain of access transistor 38 and bit line 60, and phase change element 48 is connected between the drain of access transistor 48 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to source. Additionally, instead of MOS transistors, bipolar transistors or diodes may be used as an access device.

Figure 3:
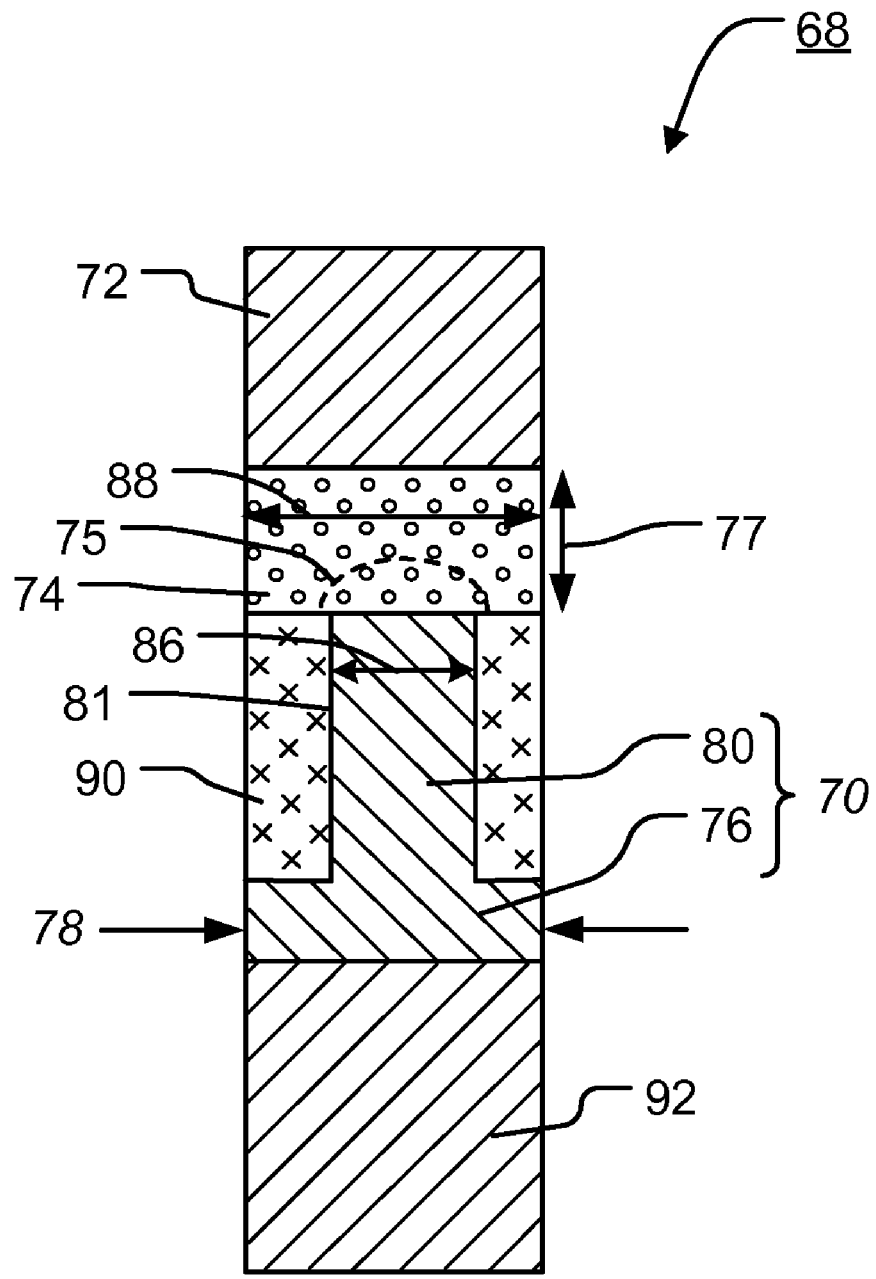
FIG. 3 is a cross-sectional view of a memory cell having an inverted t-shaped bottom electrode.

FIG. 3 illustrates a memory cell 68 having an inverted T-shaped bottom electrode 70. The bottom electrode 70 includes a base portion 76 having a first width 78 (which in some embodiments is a diameter) and a pillar portion 80 on the base portion 76 and having a second width 86 (which in some embodiments is a diameter) less than the first width 78. The larger width 78 of the base portion 76 of the bottom electrode 70 provides better mechanical stability for the bottom electrode 70 than would be achieved if the base portion 76 were the same width as the pillar portion 80.

The top surface of the pillar portion 80 contacts a memory element 74, the bottom electrode 70 coupling the memory element 74 to a conductive plug 92. The bottom electrode 70 may comprise, for example, TiN or TaN. TiN may be preferred in embodiments in which the memory element 70 comprises GST (discussed below) because it makes good contact with GST, it is a common material used in semiconductor manufacturing, and it provides a good diffusion barrier at the higher temperatures at which GST transitions, typically in the 600-700° C. range. Alternatively, the bottom electrode may be TiAlN or TaAlN, or comprises, for further examples, one or more elements selected from the group consisting of Ti, W, Mo, Al, Ta, Cu, Pt, Ir, La, Ni, N, O, and Ru and combinations thereof.

The conductive plug 92 extends to underlying access circuitry (not shown), the plug 92 comprising a refractory metal such as tungsten in the illustrated embodiment. Other metals that could be used include Ti, Mo, Al, Ta, Cu, Pt, Ir, La, Ni, and Ru. Other plug structures and materials can be used as well.

A top electrode 72 contacts the memory element 74, the top electrode 72 comprising a conductive material such as one or more of the materials described above for use as the bottom electrode 70. The top electrode 72 may comprise a portion of a bit line. Alternatively, a conductive via (not shown) may couple the top electrode 72 to a bit line.

A dielectric material 90 contacts the outer surface 81 of the pillar portion 80 of the bottom electrode 70. The dielectric material 90 preferably comprises material resistant to diffusion of the phase change material of the memory element 74, and in the illustrated embodiment comprises silicon nitride.

In operation, voltages on the plug 92 and the top electrode 72 can induce current to flow from the plug 92 to the top electrode 72, or vice-versa, via the bottom electrode 70 and the memory element 74.

The active region 75 is the region of the memory element 74 in which the memory material is induced to change between at least two solid phases. As can be appreciated the active region 75 can be made extremely small in the illustrated structure, thus reducing the magnitude of current needed to induce a phase change. The thickness 77 of the memory material of the memory element 74 can be established using a thin film deposition technique of memory material on the bottom electrode 70. In some embodiments the thickness 77 is less than or equal to about 100 nm, for example being between 10 and 100 nm. Furthermore, the width or diameter 86 of the pillar portion 80 of the bottom electrode 70 is less than the width 88 of the memory element 74 and is preferably less than a minimum feature size for a process, typically a lithographic process, used to form the memory cell 68. The small pillar portion 80 of the bottom electrode 70 concentrates current density in the portion of the memory element 74 adjacent the bottom electrode 70, thereby reducing the magnitude of the current needed to induce a phase change in the active region 75. Additionally, the dielectric material 90 can provide some thermal isolation to the active region which also helps to reduce the amount of current necessary to induce a phase change.

FIGS. 4-14 illustrate steps in a fabrication sequence for manufacturing memory cells having a reverse t-shaped bottom electrode as described herein.

Figure 4:
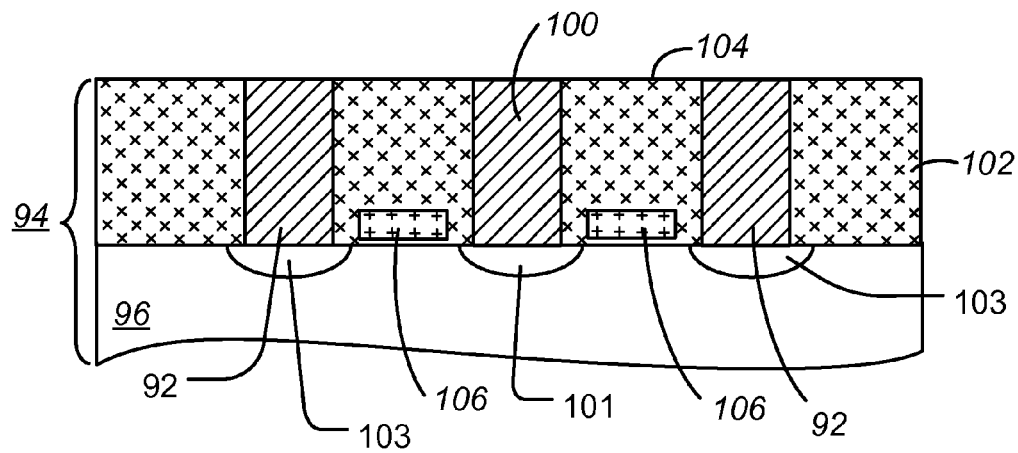
FIGS. 4-14 illustrate stages of the manufacture of the memory cell device of FIG. 3.

FIG. 4 illustrates a cross-sectional view of a first step of providing a memory access layer 94 having a top surface 104. The memory access layer 14 can be formed by standard processes as known in the art and includes word lines 106 extending in a direction into and out of the cross section illustrated in FIG. 4. The word lines 106 overly a substrate 96 and form the gates of access transistors. Access layer 94 also includes a common source line 100 contacting doped region 101 acting as the source regions of the access transistors. In other embodiments the common source line 100 may be implemented by a doped region in the substrate 96. The plugs 92 extend through dielectric 102 (typically silicon dioxide or silicon nitride) to contact corresponding doped regions 103 in the substrate 92 acting as drain regions for the access transistors.

Figure 5:
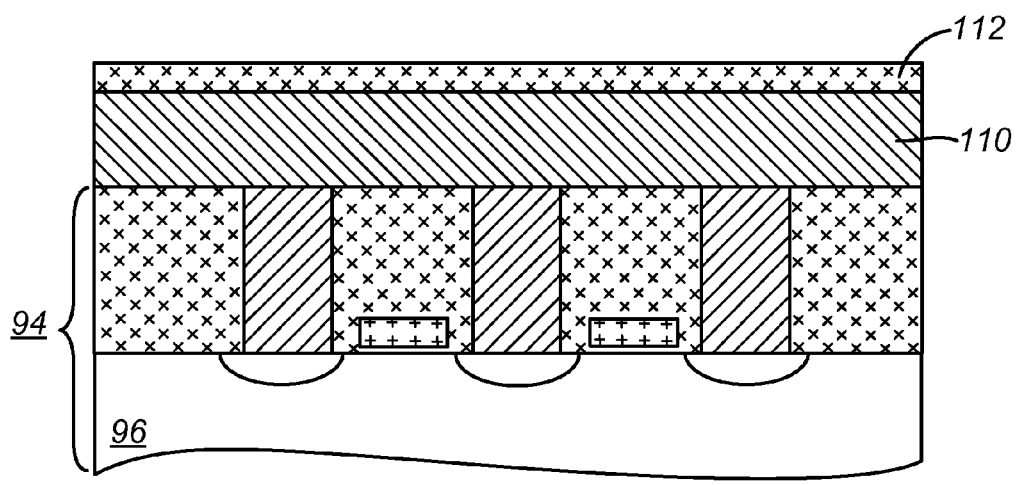

Next, a bottom electrode layer 110 is formed on the top surface 104 of the memory access layer 94 and a dielectric layer 112 is formed on the layer 110, resulting in the structure illustrated in FIG. 5. The materials of layers 110 and 112 are chosen for the ability to be selectively etched as described below. In the illustrated embodiment the bottom electrode layer 110 comprises TiN and the dielectric layer 112 comprises silicon dioxide. In some examples the bottom electrode layer 110 is about 20 to 100 nm thick while dielectric layer 112 is about 50 to 150 nm thick.

Figure 6:
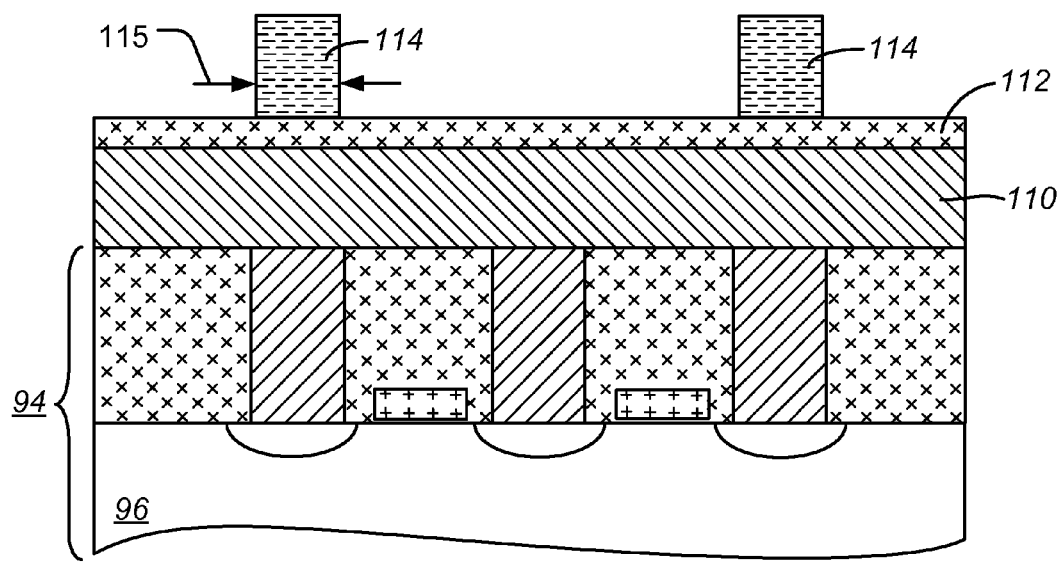

Next, masks 114 of photoresist are patterned on the dielectric layer 112 of FIG. 5, resulting in the structure illustrated in FIG. 6. The masks 114 have a width 115 that is preferably equal to a minimum feature size for the process used to form the masks 114. In one example the masks 114 have a width 115 that is between about 30 to 65 nm.

Figure 7:
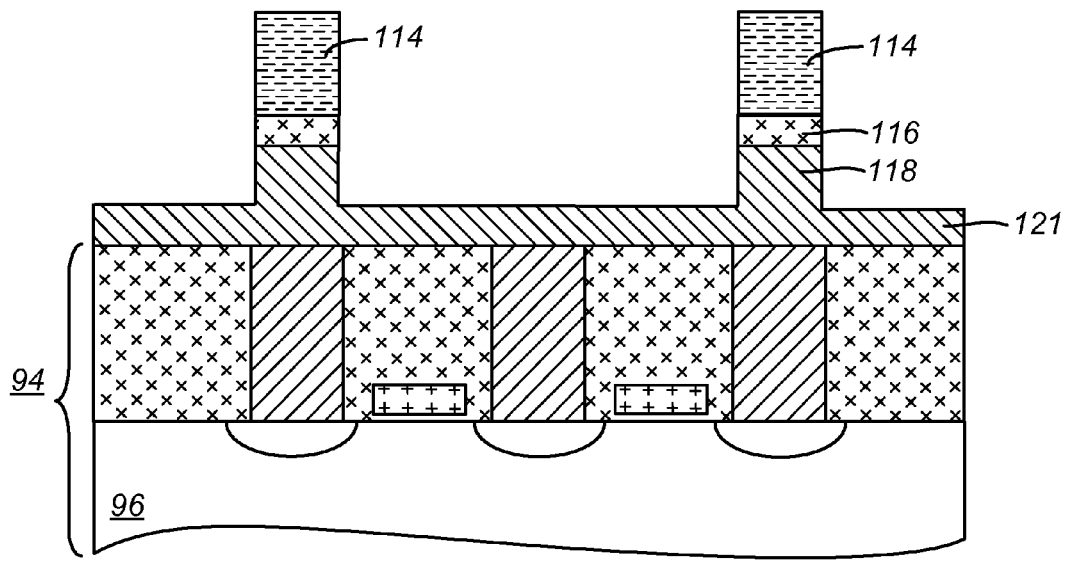

Timing mode etching is then performed to etch through a portion of the bottom electrode layer 110 using the masks 144 as an etch mask, thereby leaving partially etched layer 121 and creating dielectric element 116 from the dielectric layer 112 as shown in FIG. 7. As can be seen in the Figure, the partially etched layer 121 includes electrode layer elements 118 underlying corresponding dielectric elements 116. The timing mode etching may be done using a chlorine or fluorine based reactive ion etching process.

Figure 8:
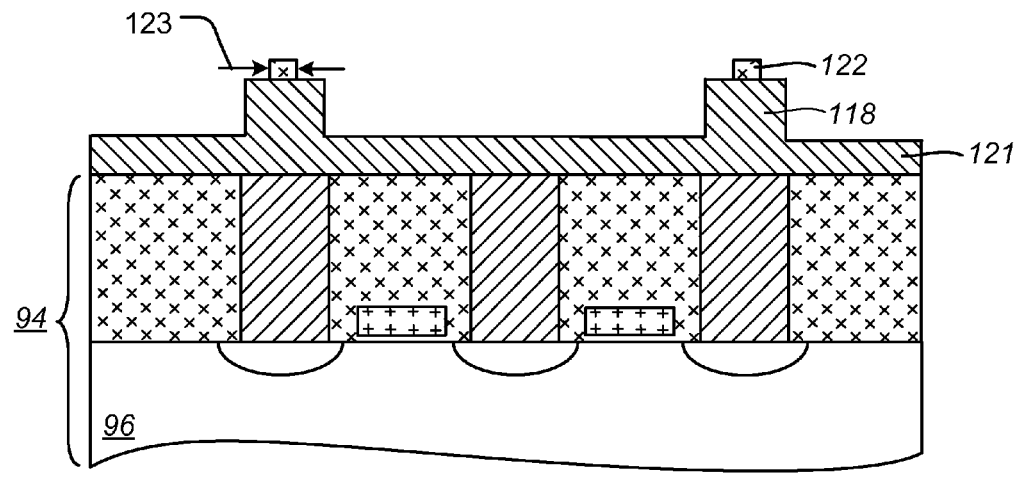

The masks 114 are then removed and the dielectric elements 116 are trimmed to reduce the width, thereby forming trimmed dielectric elements 122 having a width 123 as shown in the structure illustrated in FIG. 8. In the illustrated embodiment an isotropic etch process is used to reduce the thickness and width of the dielectric elements 116 to form the trimmed dielectric elements 122. If the dielectric elements 116 comprise an oxide, a dilute HF wet etch process can be used to trim the elements 116. Alternatively, isotropic reactive ion etching RIE can be applied to a variety of dielectric materials to trim the elements 116. As can be seen in the Figure, the elements 122 have a width 123 less than that of the electrode layer elements 118 and cover only a portion of the electrode layer element 118. Therefore, the width 123 can be less than the minimum feature size of the process used to form the electrode layer elements 118.

Figure 9:
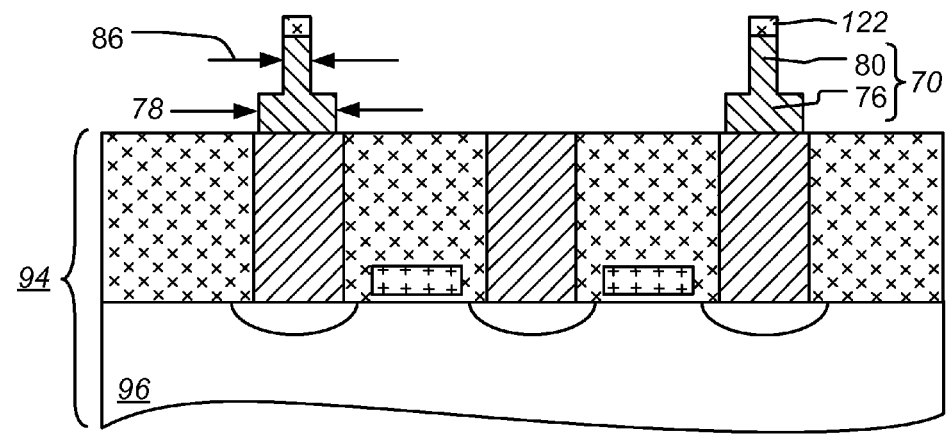

Next, anisotropic etching is performed on the partially etched layer 121 using the trimmed dielectric elements 122 as a mask to form bottom electrodes 70, resulting in the structure illustrated in FIG. 9. The anisotropic etching of the layer 121 is performed until the top surface 104 of the memory access layer 94 is reached, thereby forming the bottom electrodes 70 with the pillar portion 80 having a width 86 less than the width 78 of the base portion 76. Therefore, the width 86 of the pillar portion 86 of the bottom electrode 70 can be less than the minimum feature size of the process used to form the electrode layer elements 118. The larger width 78 of the base portion 76 of the bottom electrode 70 provides better adhesion of the bottom electrode 70 and reduces the risk of the bottom electrode falling over during manufacturing than would be achieved if the base portion 76 were the same width as the pillar portion 80. This improved mechanical stability of the bottom electrode 70 improves the yield of the device during manufacturing.

Figure 10:
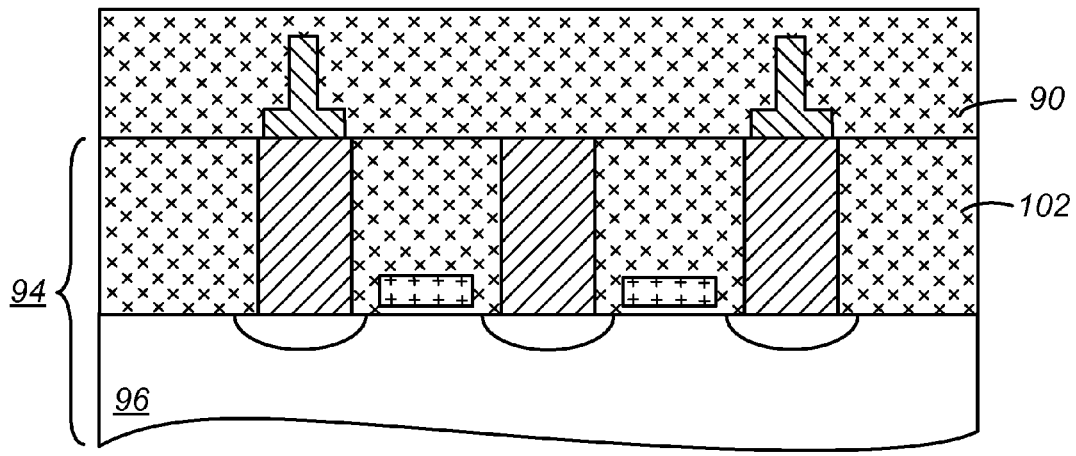

Next, second dielectric layer 90 is formed on the structure illustrated in FIG. 9, resulting in the structure illustrated in FIG. 10. The second dielectric layer 90 preferably comprises a material such as silicon nitride that is resistant to diffusion of subsequently formed phase change material, and can be the same material as dielectric layer 102.

Figure 11:
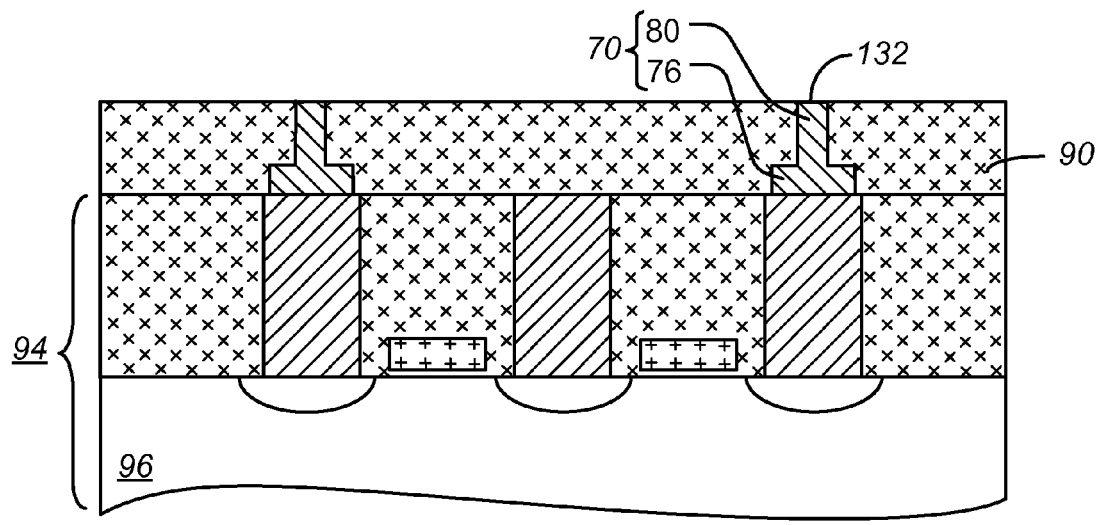

Next, a planarization process such as chemical mechanical polishing CMP is performed on the structure illustrated in FIG. 10 to expose a top surface 132 of the pillar portion 80 of the bottom electrodes 70, resulting in the structure illustrated in FIG. 11.

Figure 12:
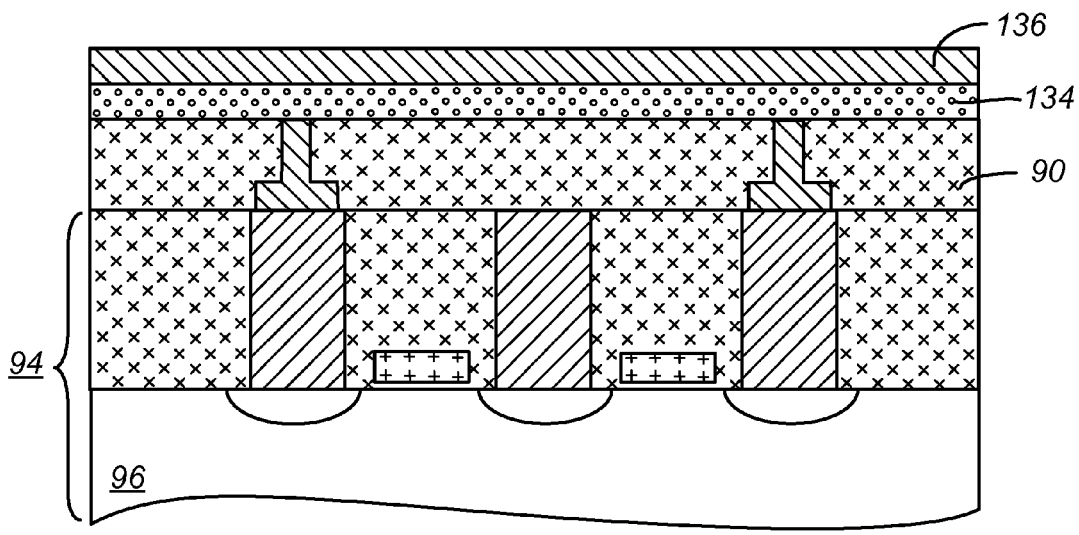

A memory material layer 134 is then formed on the top surface 132 of the bottom electrodes 70 and a top electrode material layer 136 is formed on the layer 134, resulting in the structure illustrated in FIG. 12. The memory layer 134 and the top electrode layer 136 can each be less than 100 nm thick, for example both being between about 10 to 100 nm thick.

Figure 13:
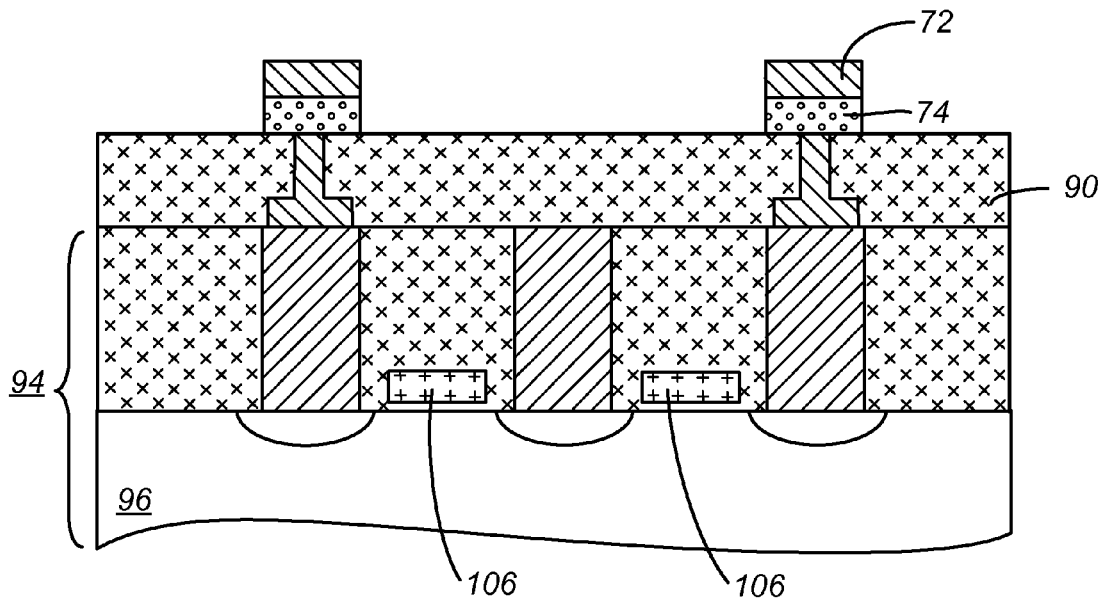

Next, the memory layer 134 and the top electrode layer 136 are patterned to form a multi-layer stack comprising a memory element 74 and a top electrode 72, resulting in the structure illustrated in FIG. 13. Alternatively, the memory layer 134 and the top electrode layer 136 may be patterned to form bit lines from the top electrode layer 136 that extend in parallel in a direction perpendicular to the word lines 106.

Figure 14:
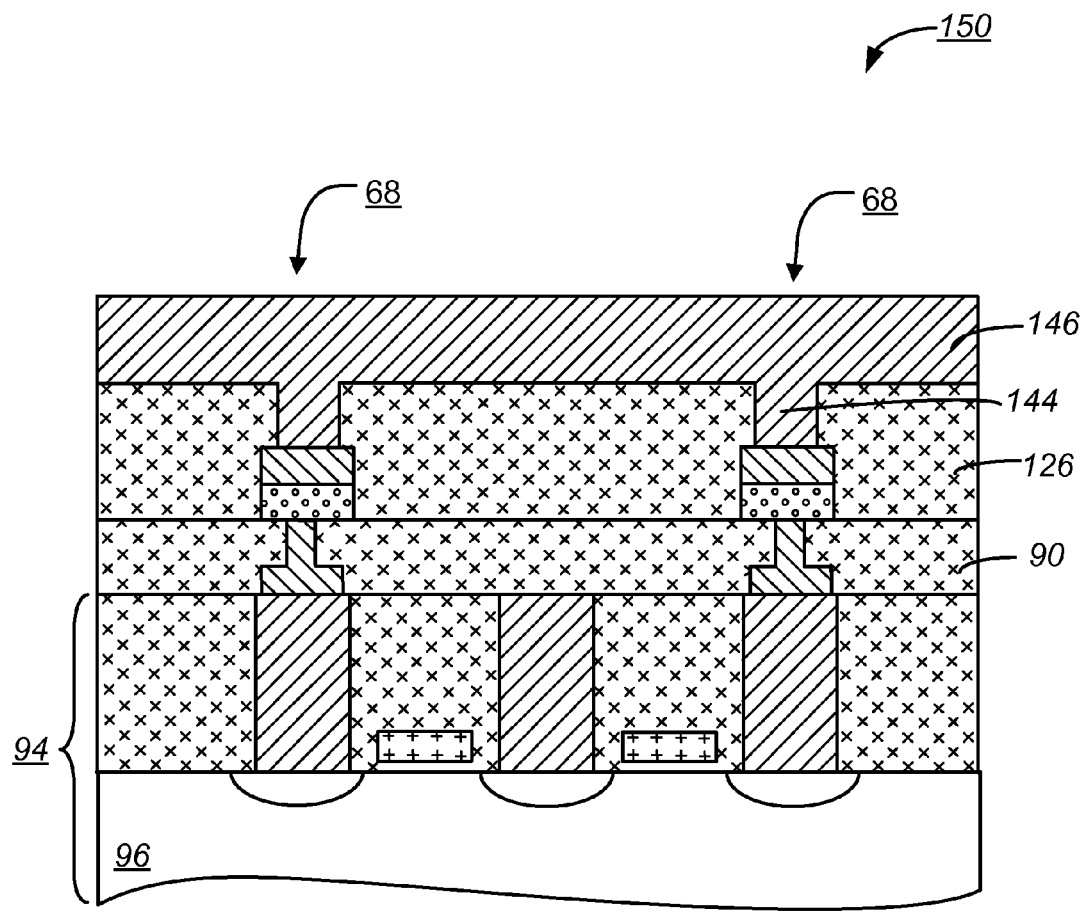

FIG. 14 illustrates the result of forming another dielectric layer 126 on the layer 90 and forming openings in the layer 126 that are generally aligned with corresponding top electrodes 72. An electrically conductive layer is then deposited on the layer 126 and within the openings to form vias 144, followed by patterning of conductive layer 142 to create a bit line 146 and form device 150. The device 150 includes an array of memory cells 68 illustrated in FIG. 3.

Figure 15:
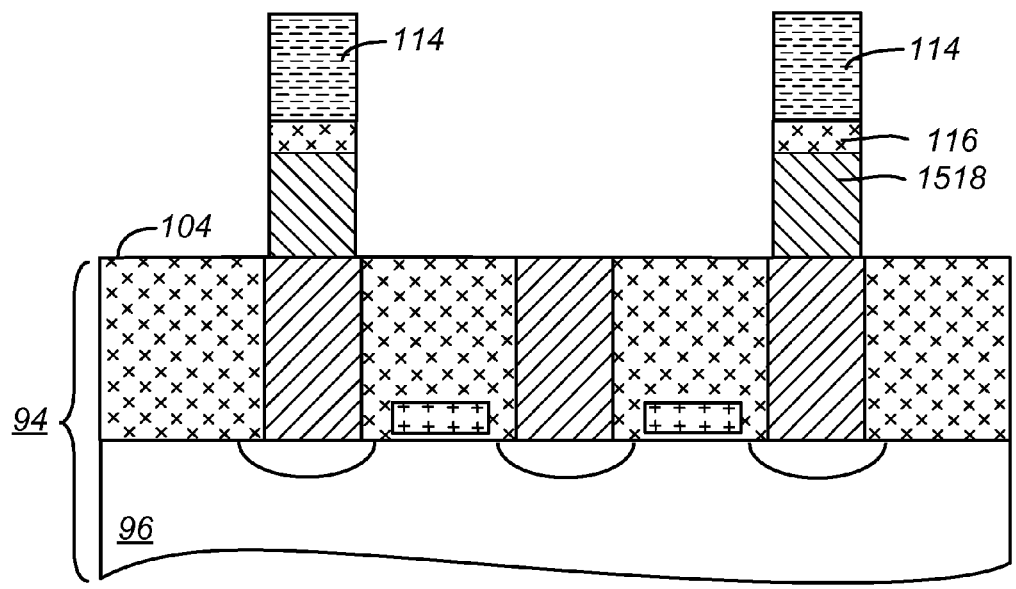
FIGS. 15-17 illustrate an alternative fabrication sequence to that illustrated in FIGS. 7-9.
Figure 16:
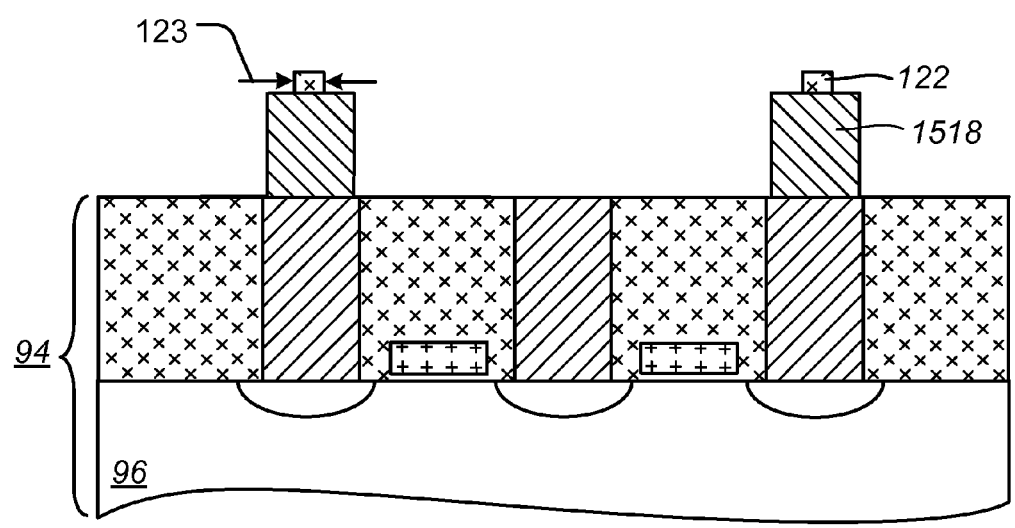
Figure 17:
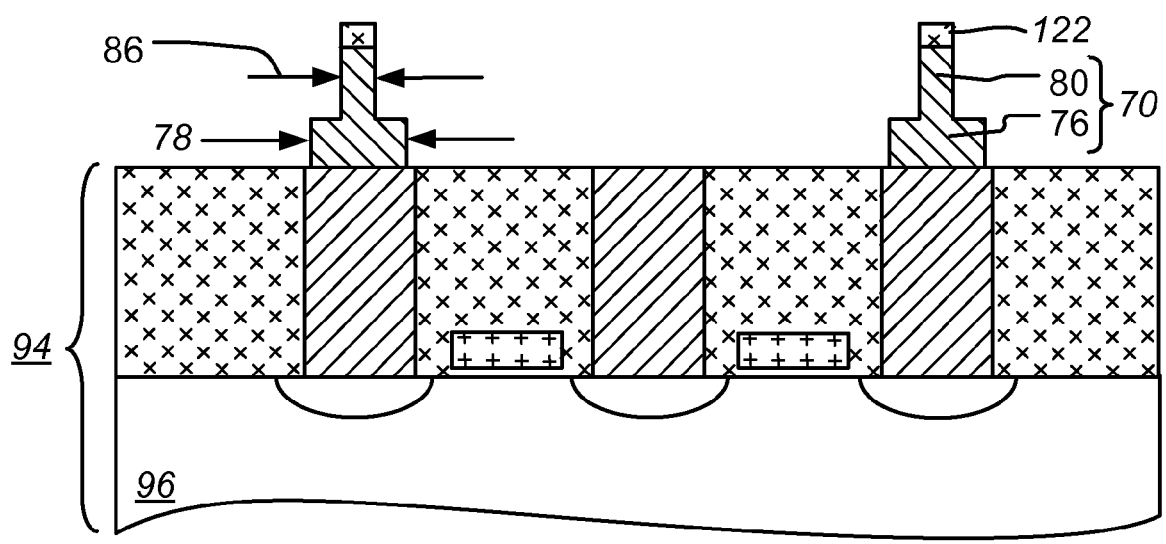

FIGS. 15-17 illustrate an alternative fabrication sequence to that illustrated in FIGS. 7-9.

Etching is performed on the structure illustrated in FIG. 6 using the masks 144 as an etch mask to expose the top surface 104 of the memory access layer 94. The etching forms dielectric elements 116 from the dielectric layer 112 and electrode layer elements 1518 from the bottom electrode layer 110, resulting in the structure illustrated in FIG. 15.

The masks 114 are then removed and the dielectric elements 116 are trimmed to reduce the width, thereby forming trimmed dielectric elements 122 having a width 123 as shown in the structure illustrated in FIG. 16. In the illustrated embodiment an isotropic etch process is used to reduce the thickness and width of the dielectric elements 116 to form the trimmed dielectric elements 122. If the dielectric elements 116 comprise an oxide, a dilute HF wet etch process can be used to trim the elements 116. Alternatively, isotropic reactive ion etching RIE can be applied to a variety of dielectric materials to trim the elements 116. As can be seen in the Figure, the elements 122 have a width 123 less than that of the electrode layer elements 1518 and cover only a portion of the electrode layer elements 1518. Therefore, the width 123 can be less than the minimum feature size of the process used to form the electrode layer elements 1518.

Next, anisotropic timing mode etching is performed on the electrode layer elements 1518 using the trimmed dielectric elements 122 as a mask to form bottom electrodes 70, resulting in the structure illustrated in FIG. 17. The timing mode etching forms the bottom electrodes 70 with the pillar portion 80 having a width 86 less than the width 78 of the base portion 76. Therefore, the width 86 of the pillar portion 86 of the bottom electrode 70 can be less than the minimum feature size of the process used to form the electrode layer elements 1518. The larger width 78 of the base portion 76 of the bottom electrode 70 provides better adhesion of the bottom electrode 70 and reduces the risk of the bottom electrode falling over during manufacturing than would be achieved if the base portion 76 were the same width as the pillar portion 80. This improved mechanical stability of the bottom electrode 70 improves the yield of the device during manufacturing.

Dielectric material 90 may comprise an electrical insulator including one or more elements selected from the group consisting of Si, Ti, Al, Ta, N, O, and C. In preferred devices, dielectric material 90 may have a low thermal conductivity, less than about 0.014 J/cm*K*sec. In other preferred embodiments, when memory element 74 is made from a phase change material, dielectric material 90 may have a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating dielectric material 90 include $SiO_2$, SiCOH, polyimide, polyamide, and fluorocarbon polymers. Other examples of materials which are candidates for use for the thermally insulating dielectric material 90 include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within dielectric material 90 can provide thermal and electrical insulation.

Useful characteristics of a programmable resistive type of memory material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. In following sections of the disclosure, the phase change or other memory material is often referred to as GST, and it will be understood that other types of phase change materials can be used. A material useful for implementation of a memory cell as described herein is Ge2Sb2Te5.

A memory cells as described herein are readily manufacturable using standard lithography and thin film deposition technologies, without requiring extraordinary steps to form sub-lithographic patterns, while achieving very small dimensions for the region of the cell that actually changes resistivity during programming. In embodiments of the invention, the memory material may be a programmable resistive material, typically a phase change material, such as $Ge_2Sb_2Te_5$ or other materials described below. The region in the memory element 74 that changes phase is small, and accordingly, the magnitude of the reset current required for changing the phase is very small.

Embodiments of memory cell 68 include phase change based memory materials, including chalcogenide based materials and other materials, for memory element 74. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a-b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

Representative chalcogenide material can be characterized as follows: GexSbyTez, where x:y:z=2:2:5. Other compositions can be used with x: 0~5; y: 0~5; z: 0~10. GeSbTe with doping, such as N—, Si—, Ti—, or other element doping, may also be used. These materials can be formed by PVD sputtering or magnetron-sputtering with reactive gases of Ar, N2, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously. The post deposition annealing treatment with vacuum or N2 ambient is sometimes needed to improve the crystallized state of chalcogenide material. The annealing temperature typically ranges 100° C. to 400° C. with an anneal time of less than 30 minutes.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A method for manufacturing a memory cell, the method comprising:

forming a bottom electrode comprising a base portion and a pillar portion on the base portion, the pillar portion having a top surface and a width less than that of the base portion;

forming a memory element on the top surface of the pillar portion of the bottom electrode, wherein the memory element comprises memory material having at least two solid phases; and forming a top electrode on the memory element; wherein forming the bottom electrode comprises:

forming a bottom electrode material layer;

forming a dielectric material layer on the bottom electrode material layer;

patterning an etch mask on the dielectric material layer;

etching through at least a portion of the bottom electrode material layer using the etch mask, thereby forming an electrode element comprising bottom electrode material and a dielectric element comprising the dielectric material on the electrode element, the dielectric element having a width;

reducing the width of the dielectric element; and etching the electrode element using the reduced width dielectric element as a mask.

2. The method of claim 1, wherein the width of the pillar portion is less than a minimum feature size for a lithographic process used to form the memory cell.

3. The method of claim 1, further comprising forming a dielectric material surrounding an outside surface of the pillar portion.

4. The method of claim 1, wherein reducing the width of the dielectric element comprises isotropically etching the dielectric element.

5. The method of claim 1, wherein etching through at least a portion of the bottom electrode layer comprises a timing mode etching.

6. The method of claim 1, wherein etching the electrode element comprises a timing mode etching.

7. A method for manufacturing a memory cell, the method comprising:

providing a memory access layer having a top surface, the memory access layer including a conductive plug extending to the top surface of the memory access layer;

forming a bottom electrode material layer on the top surface of the memory access layer;

forming a first dielectric layer on the bottom electrode material layer;

patterning an etch mask on the first dielectric layer and overlying the conductive plug;

etching through at least a portion of the bottom electrode material layer using the etch mask, thereby forming an electrode element comprising bottom electrode material and a dielectric element comprising the first dielectric layer on the electrode element;

isotropically etching the dielectric element to create a trimmed dielectric element covering a portion of the top surface of the electrode element;

anisotropically etching the electrode element using the trimmed dielectric element as a mask, thereby forming a bottom electrode comprising a base portion on the conductive plug and a pillar portion on the base portion, the pillar portion having a width less than that of the base portion;

forming a second dielectric layer on the bottom electrode;

performing a planarizing process to expose a top surface of the pillar portion of the bottom electrode;

forming a memory material layer on the top surface of the pillar portion of the bottom electrode;

forming a top electrode material layer on the memory material layer; and patterning the memory material layer and the top electrode layer to form a multi-layer stack.

8. The method of claim 7, further comprising:

forming a third dielectric layer on the multi-layer stack;

forming an opening in the third dielectric layer overlying the multi-layer stack;

forming a layer of bit line material on the third dielectric layer and within the opening; and patterning the layer of bit line material.

9. The method of claim 7, wherein:

the etching through at least a portion of the bottom electrode material layer comprises a timing mode etching to form a remaining portion of the bottom electrode material layer on the top surface of the memory access layer; and the anisotropic etching of the electrode element comprises etching the remaining portion of the bottom electrode material layer to expose the top surface of the memory access layer.

10. The method of claim 7, wherein:

the etching through at least a portion of the bottom electrode material layer comprises etching through the bottom electrode material layer to expose the top surface of the memory access layer; and the anisotropic etching of the electrode element comprises a timing mode etching.

* * * * *